US006214746B1

(12) United States Patent
Leung et al.

(10) Patent No.: US 6,214,746 B1
(45) Date of Patent: Apr. 10, 2001

(54) NANOPOROUS MATERIAL FABRICATED USING A DISSOLVABLE REAGENT

(75) Inventors: Roger Leung, San Jose; Wenya Fan, Cupertino; John Silkonia, Morgan Hill; Hui-Jung Wu, Fremont, all of CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 09/420,611

(22) Filed: Oct. 18, 1999

Related U.S. Application Data

(60) Provisional application No. 60/133,218, filed on May 7, 1999.

(51) Int. Cl.[7] .......................... H01L 21/31; H01L 21/469

(52) U.S. Cl. ............................................ 438/780; 438/781

(58) Field of Search .................................... 438/780, 781, 438/623

(56) References Cited

U.S. PATENT DOCUMENTS 5,458,709 * 10/1995 Kamezaki et al. ..................... 156/89
5,593,526 * 1/1997 Yokouchi et al. ..................... 156/89
5,744,399 * 4/1998 Rostoker et al. .................... 438/622
5,776,990 * 7/1998 Hedrick et al. ........................ 521/77

* cited by examiner

*Primary Examiner*—Richard Booth
*Assistant Examiner*—Alexander G. Ghyka
(74) *Attorney, Agent, or Firm*—Fish & Associates, LLP; Robert D. Fish

(57) ABSTRACT

Nanoporous low dielectric constant materials are fabricated from a first reagent and a second reagent. The reagents are mixed to give a reagent mixture and a polymeric structure is formed from the reagent mixture. Nanosized voids are created by removing at least in part the second reagent from the polymeric structure by a method other than thermolysis, and other than evaporation.

18 Claims, 1 Drawing Sheet

NANOPOROUS MATERIAL FABRICATED USING A DISSOLVABLE REAGENT

This application claims benefit to Provisional Application 60/133218 filed May 7, 1999.

FIELD OF THE INVENTION

The field of the invention is nanoporous materials.

BACKGROUND

As the size of functional elements in integrated circuits decreases, complexity and interconnectivity increases. To accommodate the growing demand of interconnections in modem integrated circuits, on-chip interconnections have been developed. Such interconnections generally consist of multiple layers of metallic conductor lines embedded in a low dielectric constant material. The dielectric constant in such material has a very important influence on the performance of an integrated circuit. Materials having low dielectric constants (i.e., below 2.5) are desirable because they allow faster signal velocity and shorter cycle times. In general, low dielectric constant materials reduce capacitive effects in integrated circuits, which frequently leads to less cross talk between conductor lines, and allows for lower voltages to drive integrated circuits.

Low dielectric constant materials can be characterized as predominantly inorganic or organic. Inorganic oxides often have dielectric constants between 2.5 and 4, which tends to become problematic when device features in integrated circuits are smaller than 1 $\mu$m. Organic polymers include epoxy networks, cyanate ester resins, poly(arylene ethers), and polyimides. Epoxy networks frequently show disadvantageously high dielectric constants at about 3.8–4.5. Cyanate ester resins have relatively low dielectric constants between approximately 2.5–3.7, but tend to be rather brittle, thereby limiting their utility. Polyimides and poly(arylene ethers), have shown many advantageous properties including high thermal stability, ease of processing, low stress/TCE, low dielectric constant and high resistance, and such polymers are therefore frequently used as alternative low dielectric constant polymers.

The dielectric constant of many materials can be lowered by introducing air (voids) to produce nanoporous materials. Since air has a dielectric constant of about 1.0, a major goal is to reduce the dielectric constant of nanoporous materials down towards a theoretical limit of 1. Several approaches are known in the art for fabricating nanoporous materials. In one approach, small hollow glass spheres are introduced into a material. Examples are given in U.S. Pat. No. 5,458,709 to Kamezaki and U.S. Pat. No. 5,593,526 to Yokouchi. However, the use of small, hollow glass spheres is typically limited to inorganic silicon-containing polymers.

In another approach, a thermostable polymer is blended with a thermolabile (thermally decomposable) polymer. The blended mixture is then crosslinked and the thermolabile portion thermolyzed. Examples are set forth in U.S. Pat. No. 5,776,990 to Hedrick et al. Alternatively, thermostable blocks and thermostable blocks alternate in a single block copolymer, or thermostable blocks and thermostable blocks carrying thermostable portions are mixed and polymerized to yield a copolymer. The copolymer is subsequently heated to thermolyze the thermostable blocks. Dielectrics with k-values of 2.5, or less have been produced employing thermostable portions. However, many difficulties are encountered utilizing mixtures of thermostable and thermostable polymers. For example, in some cases distribution and pore size of the nanovoids are difficult to control. In addition, the temperature difference between thermal decomposition of the thermolabile group and the glass transition temperature (Tg) of the dielectric is relatively low. Still further, an increase in the concentration of thermostable portions in a dielectric generally results in a decrease in mechanical stability.

In a further approach, a polymer is formed from a first solution in the presence of microdroplets of a second solution, where the second solution is essentially immiscible with the first solution. During polymerization, microdroplets are entrapped in the forming polymeric matrix. After polymerization, the microdroplets of the second solution are evaporated by heating the polymer to a temperature above the boiling point of the second solution, thereby leaving nanovoids in the polymer. However, generating nanovoids by evaporation of microdroplets suffers from several disadvantages. Evaporation of fluids from polymeric structures tends to be an incomplete process that may lead to undesired out-gassing, and potential retention of moisture. Furthermore, many solvents have a relatively high vapor pressure, and methods using such solvents therefore require additional heating or vacuum treatment to completely remove such solvents. Moreover, employing microdroplets to generate nanovoids often allows little control over pore size and pore distribution.

In yet another approach, U.S. Pat. No. 5,744,399 to Rostoker et al., a low dielectric constant layer is formed by fabricating a composite layer that contains one or more fullerenes and one or more matrix forming materials. The fullerenes may thereby remain in the matrix, or be removed from the matrix to produce a nanoporous material. The introduction of voids by employing fullerenes, however, has several disadvantages. For example, the molecular species of fullerenes exists only in a relatively limited size range from 32 to about 960 carbon atoms (or heteroatoms). Furthermore, the production of fullerenes, and isolation of fullerenes in a desired molecular size may incur additional cost, especially when needed in bulk quantities. Moreover, fullerenes are typically limited to a spherical shape.

Although various methods of producing nanoporous materials are know in the art, all or almost all of them suffer from one or more disadvantages. Therefore, there is a need to provide improved methods and compositions to produce nanoporous low dielectric material.

SUMMARY OF THE INVENTION

In accordance with the present invention, compositions and methods are provided in which nanoporous polymeric materials are produced. In a first step, a first reagent and a second reagent are mixed to form a reagent mixture. In a further step, a polymeric structure is formed from the reagent mixture. In another step, at least part of the second reagent is removed from the polymeric structure by a method other than thermolysis, and other than evaporation, wherein the second reagent is not a fullerenes.

In a preferred aspect of the inventive subject matter, the first reagent comprises a polymer, and in a more preferred aspect the polymer is a poly(arylene ether). In another preferred aspect of the inventive subject matter the second reagent comprises a solid, and in a more preferred aspect the solid comprises a colloidal silica, or a fumed silica, or a sol-gel-derived monosize silica.

In another preferred aspect of the inventive subject matter, at least part of the second reagent is removed by leaching. In a more preferred aspect, the leaching is accomplished using dilute hydrofluoric acid or fluorine-containing compounds. Leaching includes dissolution of the second reagent by solubilization, or etching, or reaction and dissolution of the second reagent with an acid, base, or amine-containing compound. Other alternative steps to remove at least part of the second reagent include converting the second reagent into soluble components by UV irridation, or electron beam, γ-radiation, or chemical reaction.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
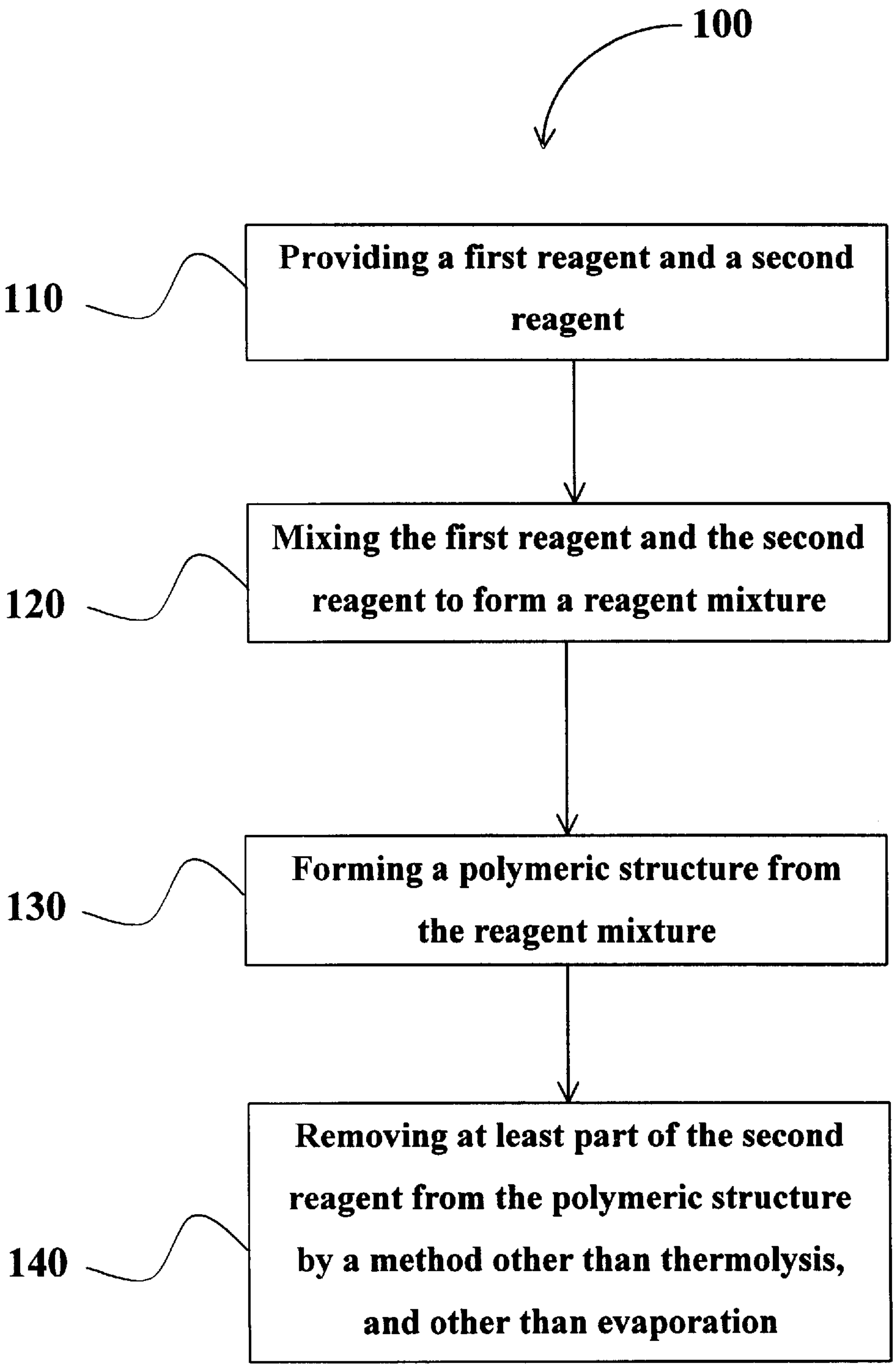
FIG. 1 depicts the process of the invention.

As used herein, the term "polymeric structure" refers to any structure that comprises a polymer. Especially contemplated are thin-film type structures, however, other structures including thick-film, or stand-alone structures are also contemplated.

As also used herein, the term "fullerene" refers to a form of naturally occurring carbon containing from 32 carbon atoms to as many as 960 carbon atoms, which is believed to have the structure of geodesic domes. Contemplated fullerenes are described in U.S. Pat. No. 5,744,399 to Rostoker et al., which is hereby incorporated by reference. In contrast, linear, branched and/or crosslinked polymers are not considered fullerenes under the scope of this definition, because such molecules are non-spherical molecules.

Referring now to FIG. 1, method 100 comprises step 110, step 120, step 130, and step 140.

In a preferred embodiment, the first reagent of step 110 is a 10 wt % solution of a poly(arylene ether) in cyclohexanone as a solvent, and the second reagent of step 110 is a 10 wt % slurry of a colloidal silica in the same, or compatible solvent. In step 120, both reagents are mixed in equal proportions, and the mixture is spin coated onto a silicon waver. A polymeric structure is formed in step 130 from the reagent mixture by heating the reagent mixture to 400° C. for 60min. At least part of the second reagent is removed in step 140 from the polymeric structure by leaching, preferably by soaking in diluted hydrofluoric acid.

In alternative embodiments, however, many polymers other than a poly(arylene ether) are contemplated for the first reagent, including organic, organometallic or inorganic polymers. Examples of organic polymeric strands are polyimides, polyesters, or polybenzils. Examples of organometallic polymeric strands are various substituted polysiloxanes. Examples of inorganic polymeric strands include silicate or aluminate. Contemplated polymeric strands may further comprise a wide range of functional or structural moieties, including aromatic systems, and halogenated groups. Furthermore, appropriate polymers may have many configurations, including a homopolymer, and a heteropolymer. It should also be appreciated that alternative polymers may have various forms, such as linear, branched, superbranched, or three-dimensional. It is further contemplated that the molecular weight of contemplated polymers may span a wide range, typically between 400 Dalton and 400000 Dalton or more.

It is further contemplated that alternative first reagent need not be a polymer, but may also be monomers. As used herein, the term "monomer" refers to any chemical compound that is capable of forming a covalent bond with itself or a chemically different compound in a repetitive manner. The repetitive bond formation between monomers may lead to a linear, branched, super-branched or three-dimensional product. Furthermore, monomers may themselves comprise repetitive building blocks, and when polymerized the polymers formed from such monomers are then termed "blockpolymers". Monomers may belong to various chemical classes of molecules including organic, organometallic or inorganic molecules. Examples of organic monomers are acrylamide, vinylchloride, fluorene bisphenol or 3,3'-dihydroxytolane. Examples of organometallic monomers are octamethyl-cyclotetrasiloxane, methylphenylcyclotetrasiloxane, etc. Examples of inorganic monomers include tetraethoxysilane or triisopropylaluinate. The molecular weight of monomers may vary greatly between about 40 Dalton and 20000 Dalton. However, especially when monomers comprise repetitive building blocks, monomers may have even higher molecular weights. Contemplated monomers may further include additional groups, such as groups used for crosslinking, solubilization, improvement of dielectric properties, and so on.

It should further be appreciated that various concentrations other than 10 wt% are appropriate, including concentrations of about 11% (w/v) to about 75% (w/v) and more, but also concentrations of about 9% (w/v) to about 0.1% (wlv) and less.

With respect to the solvent, the first reagent need not be limited to cyclohexanone. Many other solvents are also contemplated, including polar, apolar, protic and non-protic solvents, or any reasonable combination thereof. For example, appropriate solvents are water, hexane, xylene, methanol, acetone, anisole, and ethylacetate. It should also be appreciated that in some cases only minor quantities of solvent may be utilized, and in other cases no solvent may be required at all.

In further alternative embodiments, many silicon-containing reagents other than colloidal silica are contemplated as second reagent, including fumed silica, siloxanes, silsequioxanes, and solgel-derived monosize silica. Appropriate silicon-containing compounds preferably have a size of below 100 nm, more preferably below 20 nm and most preferably below 5 nm. It is also contemplated that an alternative second reagent may comprise various materials other than silicon-containing reagents, including organic, organometallic, inorganic reagents or any reasonable combination thereof, provided that such reagents can be dissolved at least in part in a dissolving reagent that does not dissolve the polymeric structure formed from the mixture of the reagents. For example, appropriate organic reagents are polyethylene oxide, and polypropylene oxide. Organometallic reagents are, for example, metallic octoates and acetates. Inorganic reagents are, for example, NaCl, $KNO_3$, iron oxide, and titanium oxide. Especially contemplated alternative second reagents comprise nanosize polystyrene, polyethylene oxide, polypropylene oxide, and polyvinyl chloride.

With respect to the solvent of the second reagent, the same considerations apply as discussed for the solvent for the first reagent, so long as both solvents are miscible at least in part.

In still further alternative embodiments, the step of mixing the first and the second reagent may be performed in many other proportions than equal proportions. For example, appropriate proportions may consist of 0.1%–99.9% (vol.) of the first reagent in the total amount of the reagent mixture. It is furthermore contemplated that more than two reagents may be used, for example 3–5 reagents, or more. Moreover, mixing the reagents need not be performed in a single step, but may also be performed in intervals. For example, in a mixture of equal proportions of both reagents, 10 ml of the first reagent may be combined with 1 ml of the second reagent. After a first predetermined time, another 4 ml of the second reagent may be added, and after second predetermined time, the remaining 5 ml of the second reagent may be added. Similarly, it is contemplated that multiple layers of reagent mixtures may be employed to generate a plurality of layers with same or different ratio between the first and the second reagent.

Although the reagent mixture is preferably spin coated on a silicon waver, various alternative methods of applying the reagent mixture to a substrate are contemplated, including spray coating, dip coating, sputtering, brushing, doctor blading, etc. It is further contemplated that the reagent mixture need not necessarily be applied to a silicon waver as a substrate, but may also be applied to any material so long as such material is not substantially dissolvable in the solvent (s) contained in the reagent mixture.

With respect to forming a polymeric structure, many methods other than heating the reagent mixture to 400° C. for 60min are contemplated. Alternative methods include heating the reagent mixture to temperatures higher than 400° C., for example, temperatures in the range of 400° C.–500° C., or higher, but also heating to lower temperatures than 400° C., for example, temperatures in the range of 100° C. to 400° C. It is further contemplated that many durations other than 60min may be appropriate for forming a polymeric structure, including longer times in the range of 1 to several hours, and longer. Similarly, shorter durations than 60 min are also contemplated, ranging from a few seconds to several minutes, and longer. It is further contemplated that by heating remaining volatile solvent in the polymeric structure is at least partially removed. Moreover, heating may also advantageously rigidify the polymeric structure.

Although in preferred embodiment the polymeric structure is formed using heat, various alternative methods of forming the polymeric structure are contemplated, including catalyzed and uncatalyzed methods. Catalyzed methods may include general acid- and base catalysis, radical catalysis, cationic- and anionic catalysis, and photocatalysis. For example, the formation of a polymeric structure may be catalyzed by addition of hydrochloric acid or sodium hydroxide, addition of radical starters, such as ammoniumpersulfate, or by irradiation with UV-light. In other examples, the formation of a polymeric structure may be initiated by application of pressure, removal of at least one of the solvents, oxidation.

In still other alternative embodiments, various methods other than soaking the polymeric structure in dilute hydrofluoric acid are contemplated to remove at least in part the second reagent. Alternative methods may include dry etching, flushing, or rinsing the polymeric structure with dilute hydrofluoric acid. In other alternative methods, the dissolving reagents need not be restricted to hydrofluoric acid, but may comprise any other reagents, so long as it dissolves the second reagent at least in part without substantially dissolving the polymeric structure. Contemplated dissolving reagents include hydrofluoric acid, $NF_3$, and solvents according to the formula $CH_zF_{4-z}$ wherein z=0–3, and the formula $C_2H_xF_y$, wherein x is an integer between 0 and 5, and x+y is 6. In this example, the hydrofluoric acid reacts and disintegrates the silica, resulting in dissolving the silica particle form the film and thus forming pores. Particularly contemplated dissolving reagents are a 2% (w/v) aqueous solution of hydrofluoric acid, $NF_3$, and $NH_4F$, but also non-fluorinated solvents, including chlorinated hydrocarbons, cyclohexane, toluene, acetone, and ethyl acetate.

The second reagent may also be removed by dry etching where the polymeric structure is exposed to etch gases, including $H_2F_2$, $NF_3$, $CH_xF_y$, and $C_2H_xF_y$, such that the silica is converted into volatile fluorosilicon components. The volatile fluorosilicon components are subsequently removed from the polymeric structure by heating or evacuating, thus forming a porous structure.

It should also be appreciated that alternative methods need not be based on dissolving the second reagent, but may include various alternative methods other than thermolysis and other than evaporation. For example, appropriate methods include radiolysis using focused α-, or β-, or γ-rays, electromagnetic waves, chemical transformations of the second reagent, sonication, and cavitation.

EXAMPLES

The following examples are given to illustrate the formation of a nanoporous low dielectric constant material according to the inventive subject matter.

EXAMPLE 1

Preparation of a spin-on solution

Preparation of 10 wt% colloidal silica: Starting material is MIBK-ST (Nissan Chemical) 30 wt% colloidal silica in MIBK, particle size 12 nm. 80 gm of MIBK-ST were mixed with 160 gm cyclohexanone in a plastic flask with stirring. The preparation is named CS10. 1.2 gm of neat hexamethyldisilazane (HMDZ) were added to 240 gm CS10 in a plastic bottle and slowly stirred for one hour at room temperature to allow for reaction. The preparation is named CS10H. The objective is to make a more stable suspension of colloidal silica in organic solvent by modifying the surface of the colloidal silica from hydrophilic to hydrophobic.

Base Matrix Material: A solution of 10 wt% poly(arylene ether) resin in cyclohexanone is prepared and named X33.

Base Adhesion Promoter: A solution of 25 wt% polycarbosilane polymer in cylcohexanone is prepared and named A3 solution. 50/50 Poly(arylene ether)/silica Formulation: 241.2 gm of CS10H were mixed with 241.2 gm of X33, and 5.78 gm of A3 solution were added and mixed well. The final composition comprising 4.94 wt% poly(arylene ether), 4.92 wt% silica, 0.296 wt% polycarbosilane and 0.246 wt% HDMZ is sonicated for 30 minutes, filtered through a 0.1 μm filter, and collected in plastic bottle.

EXAMPLE 2

Preparation of a Low k Porous Film

The solution prepared from Example 1 was spun-coated onto an 8" silicon wafer using a SEMD coater.

Spin conditions: The films were coated on a Semix TR8002-C coater with manual dispense, top side rinse (TSR) and back side rinse (BSR). The volume of dispense was about 5 ml and cyclo-hexanone was utilized as the top and back side rinse solvent. The spin speed was 2000 rmp for 50 seconds. The films were double coated to achieve about 7000 A thickness.

Bake conditions: All wafers were baked under nitrogen on the Semix coater following each spin coating step. The bake conditions are given in the Table 1.

TABLE 1

Bake Plate Conditions

| Step | Sequence | Temperature (° C.) | Time (min.) |
|---|---|---|---|
| 1 | Hot plate 1 | 150 | 1 |
| 2 | Hot plate 2 | 200 | 1 |
| 3 | Hot plate 3 | 250 | 1 |

Cure conditions: Wafers were cured in a horizontal furnace protected by a nitrogen flow of 60 liter/min. The oxygen concentration in nitrogen was less than 50 ppm. The curing sequence is listed in Table 2. The temperature quoted is the temperature of the furnace center and was confirmed to be accurate with a thermocouple at the furnace center where the demo wafers were cured.

TABLE 2

Cure Recipe

| Cure Step | Wafer Boat Position | Temperature (° C.) | Nitrogen Flow Rate (liter/min) | Time (min) |
|---|---|---|---|---|
| 1 | The end of Furnace | 400 | 60 | 5 |
| 2 | The center of Furnace | 400 | 60 | 60 |
| 3 | The center of Furnace | 400 to 250 | 60 | 60 |
| 4 | Unload | 250 | 60 | 1 |

Wet etch conditions: Cured films were etched with 50:1 buffered oxide etcher (BOE) at room temperature for 3.0 minutes to remove the silica, thus forming porous structure. After being etched, the wafers were rinsed with deionized water, isopropyl alcohol and de-ionized water. Finally the wafers was dried at 150° C. in vacuum.

IR spectroscopy: The IR spectra of porous poly(arylene ether) films on the wafers were recorded on a Nicolet 550 infrared spectrophotometer. The amount of silica in the film was determined from the peak intensity at 1050–1150 $cm^{-1}$ whereas the concentration of poly(arylene ether) was monitored from the peak at 1500 $cm^{-1}$. Results for the peak intensity were listed in Table 3.

TABLE 3

Peak Intensity from FTIR

| | Absorbance of silica at 1100 $cm^{-1}$ | Absorbance of poly (arylene ether) at 1500 $cm^{-1}$ | Ratio of absorbance between silica and organic | Percent of silica removed |
|---|---|---|---|---|
| Post-cure | 0.495 | 0.157 | 3.15 | 0 |
| Post-etch | 0.008 | 0.157 | 0.051 | 98.4 |

No residual organic solvent, un-crosslinked acetylene group, and oxidation related IR absorption peaks are observed for the film at near 1700–1800 $cm^{-1}$ (aliphatic carbonyl group), 2900 $cm^{-1}$ (aliphatic carbon-hydrogen bond), 3500 $cm^{-1}$ (O—H bond), and 2210 $cm^{-1}$ (carbon-carbon triple bond). IR spectra of the porous FLARE™ films also indicate over 97% of embedded dielectrics has been converted to pore after wet etch.

Film thickness, thickness uniformity and refractive index: Porous poly(arylene ether) film thickness, thickness uniformity and refractive index were shown in Table 4.

TABLE 4

Film Properties

| | Film Thickness | Standard Deviation of Thickness | Refractive Index |
|---|---|---|---|
| Post-bake | 8500 Å | 0.73% | 1.60 |
| Post-cure | 8400 Å | 0.38% | 1.58 |
| Post-etch | 7370 Å | 0.95% | 1.50 |

EXAMPLE 3

Measurement of Dielectric Constant

The dielectric constant (k) of the film was calculated from the capacitance of the film with thickness (t) under aluminum dot, using a Hewlett-Packard LCR meter model HP4275A. The dielectric constant is obtained according to the following equation:

$$K=Ct/(E_oA),$$

Where A is the area of the aluminum dot ($cm^2$), C is the capacitance (Farad), t is the film thickness (cm), and $E_o$ is the permittivity of the free volume ($8.85419\times10^{-14}$ F/cm).

The dielectric constant of the low k porous poly(arylene ether) and the solid poly(aryene ether) control after various treatments were listed in Table 5.

TABLE 5

Dielectric constants

| | As-prepared | After baked out at 250 C. for 2 minutes | After soaked in water at room temperature for 48 hours | After soaked in water, followed by baked at 250 C./2 min |
|---|---|---|---|---|
| Porous Film | 2.12 | 2.07 | 2.20 | 2.06 |
| Solid Film | 2.92 | 2.80 | 3.13 | 2.80 |

A decrease in dielectric constant of about 0.73 was achieved after introducing porosity into the solid film. The dielectric constant of the porous film increased slightly by 0.13 after soaking in water at room temperature for 48 hours. However, the dielectric constant was the same as the pre-soaked value after drying in a hot plate heating for 2 minutes at 250C. No significant decrease in k was found for the porous film after heated in flowing nitrogen at 400C. for 20 hours, even though the film shrank in thickness of about 8%. Dielectric constant of the porous film was also unchanged after 30-day storage at ambient conditions.

Thus, specific embodiments and methods for producing nanoporous material using a dissolvable reagent have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms “comprises” and “comprising” should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method of producing a low dielectric nanoporous material comprising:

providing a first reagent and a second reagent;

mixing the first reagent and the second reagent to form a reagent mixture;

forming a polymeric structure from the reagent mixture; and removing at least part of the second reagent from the polymeric structure by a method other than thermolysis, and other than evaporation, wherein the second reagent does not comprise a fullerene.

2. The method of claim 1, wherein the first reagent comprises a polymer.

3. The method of claim 2, wherein the polymer is a poly(arylene ether) or a polyimide.

4. The method of claim 1, wherein the second reagent comprises a solid.

5. The method of claim 4, wherein the solid comprises an organic polymer.

6. The method of claim 5, wherein the organic polymer is selected from the group consisting of nanosized polystyrene, polyethylene oxide, polypropylene oxide, and polyvinyl chloride.

7. The method of claim 4, wherein the solid is less than 100 nm in the longest dimension.

8. The method of claim 4, wherein the solid is less than 20 nm in the longest dimension.

9. The method of claim 4, wherein the solid is less than 5 nm in the longest dimension.

10. The method of claim 4, wherein the solid comprises a silicon-containing compound.

11. The method of claim 10, wherein the silicon-containing compound is selected from the group consisting of a colloidal silica, a fumed silica, a sol-gel-derived monosize silica, a siloxane, and a silsesquioxane.

12. The method of claim 1, wherein the step of removing comprises leaching.

13. The method of claim 12, wherein the step of leaching comprises utilizing a fluorine-containing compound.

14. The method of claim 12, wherein the step of leaching comprises utilizing at least one of a chlorinated hydrocarbon, cyclohexane, toluene, acetone, and ethyl acetate.

15. The method of claim 13, wherein the fluorine-containing compound is selected from the group consisting of HF, $CF_4$, $NF_3$, $CH_zF_{4-z}$ and $C_2H_xF_y$, wherein x is an integer between 0 and 5, x+y is 6, and z is an integer between 0 and 3.

16. The method of claim 1, wherein the first reagent comprises a polymer selected from the group consisting of a poly(arylene ether), and a polyimide, and wherein the second reagent comprises a silicon-containing compound, and wherein the step of removing comprises leaching.

17. The method of claim 1, wherein the first reagent comprises a polymer selected from the group consisting of a poly(arylene ether), and a polyimide, the second reagent comprises a silicon-containing compound, and wherein the step of removing comprises leaching utilizing a fluorine-containing compound selected from the group consisting of HF, $CF_4$, $NF_3$, $NH_4F$, $CH_zF_{4-z}$and $C_2H_xF_y$, wherein x is an integer between 0 and 5, x+y is 6, and z is an integer between 0 and 3.

18. The method of claim 1, wherein the first reagent comprises a polymer selected from the group consisting of a polyarylene ether, and a polyimide, the second reagent comprises a silicon-containing compound selected from the group consisting of a colloidal silica, a fumed silica, and a sol-gel-derived monosize silica, and wherein the step of removing comprises leaching utilizing a fluorine-containing compound selected from the group consisting of HF, $CF_4$, $NF_3$, $CH_zF_{4-z}$ and $C_2H_xF_y$, wherein x is an integer between 0 and 5, x+y is 6, and z is an integer between 0 and 3.

* * * * *